United States Patent
Oonishi et al.

(10) Patent No.: US 9,131,612 B2
(45) Date of Patent: Sep. 8, 2015

(54) AUTOMOTIVE ALTERNATOR RECTIFYING APPARATUS

(75) Inventors: Toshiyuki Oonishi, Tokyo (JP);
Kazunori Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 227 days.

(21) Appl. No.: 13/818,249

(22) PCT Filed: Oct. 19, 2010

(86) PCT No.: PCT/JP2010/068324
§ 371 (c)(1),
(2), (4) Date: Feb. 21, 2013

(87) PCT Pub. No.: WO2012/053051
PCT Pub. Date: Apr. 26, 2012

(65) Prior Publication Data
US 2013/0155635 A1    Jun. 20, 2013

(51) Int. Cl.
| | |
|---|---|
| H02K 11/00 | (2006.01) |
| H02K 11/04 | (2006.01) |
| H02K 19/36 | (2006.01) |
| H05K 1/00 | (2006.01) |
| H05K 1/18 | (2006.01) |
| H05K 7/00 | (2006.01) |
| H05K 7/10 | (2006.01) |

(52) U.S. Cl.
CPC .............. *H05K 7/10* (2013.01); *H02K 11/046* (2013.01)

(58) Field of Classification Search
None
See application file for complete search history.

(56) References Cited

U.S. PATENT DOCUMENTS

| | | | | |
|---|---|---|---|---|
| 3,959,676 A | * | 5/1976 | Striker | 310/68 D |
| 4,975,824 A | * | 12/1990 | Huss et al. | 363/132 |
| 5,043,614 A | * | 8/1991 | Yockey | 310/68 D |
| 5,451,823 A | * | 9/1995 | Deverall et al. | 310/68 D |
| 5,640,062 A | * | 6/1997 | Yockey | 310/68 D |
| 5,659,212 A | * | 8/1997 | DePetris | 310/68 D |
| 5,991,184 A | * | 11/1999 | Russell et al. | 363/145 |

(Continued)

FOREIGN PATENT DOCUMENTS

| | | |
|---|---|---|
| JP | 3760906 B2 | 3/2006 |
| JP | 2007-35648 A | 2/2007 |

(Continued)

OTHER PUBLICATIONS

Communication dated Jan. 16, 2015 from the State Intellectual Property Office of the People's Republic of China in counterpart application No. 201080069694.4.

*Primary Examiner* — Hoa C Nguyen
*Assistant Examiner* — Xanthia C Cunningham
(74) *Attorney, Agent, or Firm* — Sughrue Mion, PLLC

(57) ABSTRACT

An automotive alternator rectifying apparatus includes a circuit board that connects a positive-side rectifying element mounted to the positive-side heatsink and a negative-side rectifying element mounted to the negative-side heatsink to configure a bridge circuit. The circuit board includes a tubular lead guiding portion that includes a lead insertion aperture; and a terminal that is disposed so as to extend outward in an aperture direction of the lead insertion aperture from an exit edge portion of the lead insertion aperture, and to which is connected a lead that is subject to connection that is inserted through an entrance of the lead insertion aperture and that extends outward from an exit, and the lead insertion aperture is formed such that cross-sectional area thereof becomes gradually smaller from the entrance toward the exit.

4 Claims, 8 Drawing Sheets

(56) References Cited

U.S. PATENT DOCUMENTS

| | | | |
|---|---|---|---|
| 6,429,556 B1* | 8/2002 | Nakamura et al. | 310/71 |
| 6,528,911 B1* | 3/2003 | De Petris | 310/64 |
| 6,538,352 B2* | 3/2003 | Asao | 310/68 D |
| 6,734,587 B2* | 5/2004 | Hirsou et al. | 310/68 D |
| 7,511,392 B2* | 3/2009 | Rubbo et al. | 310/68 D |
| 7,876,007 B2* | 1/2011 | Lybbert | 310/71 |
| 2002/0053841 A1* | 5/2002 | Asao | 310/68 B |
| 2002/0136041 A1* | 9/2002 | DeNardis | 363/144 |
| 2003/0178900 A1* | 9/2003 | Kumagai | 310/102 R |
| 2003/0197437 A1 | 10/2003 | Horioka et al. | |
| 2004/0036368 A1* | 2/2004 | Nguyen | 310/68 D |
| 2006/0131969 A1* | 6/2006 | DePetris et al. | 310/68 D |
| 2006/0284499 A1* | 12/2006 | Rubbo et al. | 310/68 D |
| 2007/0040531 A1* | 2/2007 | Oohashi et al. | 318/723 |
| 2007/0108854 A1* | 5/2007 | Osborn et al. | 310/68 D |
| 2010/0156206 A1* | 6/2010 | Nishitani et al. | 310/52 |
| 2011/0215659 A1* | 9/2011 | Amaral | 310/52 |

FOREIGN PATENT DOCUMENTS

| | | |
|---|---|---|
| JP | 2009-112149 A | 5/2009 |
| JP | 2009-207274 A | 9/2009 |

* cited by examiner

AUTOMOTIVE ALTERNATOR RECTIFYING APPARATUS

CROSS REFERENCE TO RELATED APPLICATIONS

This application is a National Stage of International Application No. PCT/JP2010/068324, filed on Sep. 19, 2010, the contents of all of which are incorporated herein by reference in their entirety.

TECHNICAL FIELD

The present invention relates to an automotive alternator rectifying apparatus, and particularly relates to a connecting portion construction between a rectifying element lead and a circuit board terminal.

BACKGROUND ART

In conventional alternator rectifiers, connecting portions that are configured by connecting unidirectional conducting element leads that are joined by press-fitting into recess portions of a heatsink and circuit board terminals are disposed between a circuit board and a rear-end fan (see Patent Literature 1, for example).

CITATION LIST

Patent Literature

Patent Literature 1: International Publication No. WO/2006/033136 (Pamphlet)

SUMMARY OF THE INVENTION

Problem to be Solved by the Invention

Although not described in detail, in Patent Literature 1, the terminals are constituted by portions of inserted conductors that are insert-molded into a circuit board that project from the circuit board, and are formed so as to move close to tip ends of the unidirectional conducting element leads that are joined to the heatsink when the circuit board and heatsink are assembled. Then, terminals and leads that are in close proximity are placed in contact with each other by gripping, and the two are joined together by welding during assembly.

However, because the unidirectional conducting elements are press-fitted into each of six recess portions that are formed on the heatsink, and respective lead lengths of the unidirectional conducting elements are long, it is difficult to ensure positioning accuracy near the tip ends of all of the unidirectional conducting element leads with high precision. Thus, one problem has been that positioning between the unidirectional conducting element leads and the circuit board terminals during assembly is difficult, making welding workability poor.

Because the unidirectional conducting element leads and the circuit board terminals are exposed, another problem has been that short-circuiting with other parts due to exposure to moisture or vibration is more likely to occur when the alternator is mounted to a vehicle.

The present invention aims to solve the above problems and an object of the present invention is to provide an automotive alternator rectifying apparatus that can facilitate positioning of a lead that is subject to connection relative to a terminal and that can also suppress occurrences of short-circuiting with other parts by disposing on a circuit board a tubular lead guiding portion that guides the lead that is subject to connection to the terminal and passing the lead through the lead guiding portion.

Means for Solving the Problem

In order to achieve the above object, according to one aspect of the present invention, there is provided an automotive alternator rectifying apparatus that rectifies an alternating-current electromotive force that is generated in an automotive alternator stator into direct current, the rectifying apparatus including: a positive-side heatsink to which a positive-side rectifying element is mounted; a negative-side heatsink that is disposed so as to be separated from the positive-side heatsink, and to which a negative-side rectifying element is mounted; and a circuit board that is disposed so as to be stacked with the positive-side heatsink and the negative-side heatsink, and that connects the positive-side rectifying element and the negative-side rectifying element to configure a bridge circuit. The circuit board includes: a tubular lead guiding portion that includes a lead insertion aperture; and a terminal that is disposed so as to extend outward in an aperture direction of the lead insertion aperture from an exit edge portion of the lead insertion aperture, and to which is connected a lead that is subject to connection that is inserted through an entrance of the lead insertion aperture and that extends outward from an exit, and the lead insertion aperture is formed such that cross-sectional area thereof becomes gradually smaller from the entrance toward the exit.

Effects of the Invention

According to the present invention, a terminal is disposed so as to extend outward in an aperture direction of a lead insertion aperture from an exit edge portion of the lead insertion aperture, which is formed such that cross-sectional area thereof becomes gradually smaller from an entrance toward an exit. Thus, a tip end of a lead that is subject to connection is displaced so as to approach the terminal as the lead moves toward the exit from the entrance of the lead insertion aperture. Because the tip end of the lead that is subject to connection that extends outward from the exit of the lead insertion aperture is in close proximity to the terminal, positioning between the terminal and the lead that is subject to connection is facilitated, improving welding workability.

Because large portions of the terminal and the lead that is subject to connection are housed inside the lead guiding portion, occurrences of short-circuiting with other parts due to exposure to moisture, vibration, etc., when the automotive alternator is mounted to a vehicle are suppressed.

DESCRIPTION OF EMBODIMENTS

Embodiment 1

Figure 1:
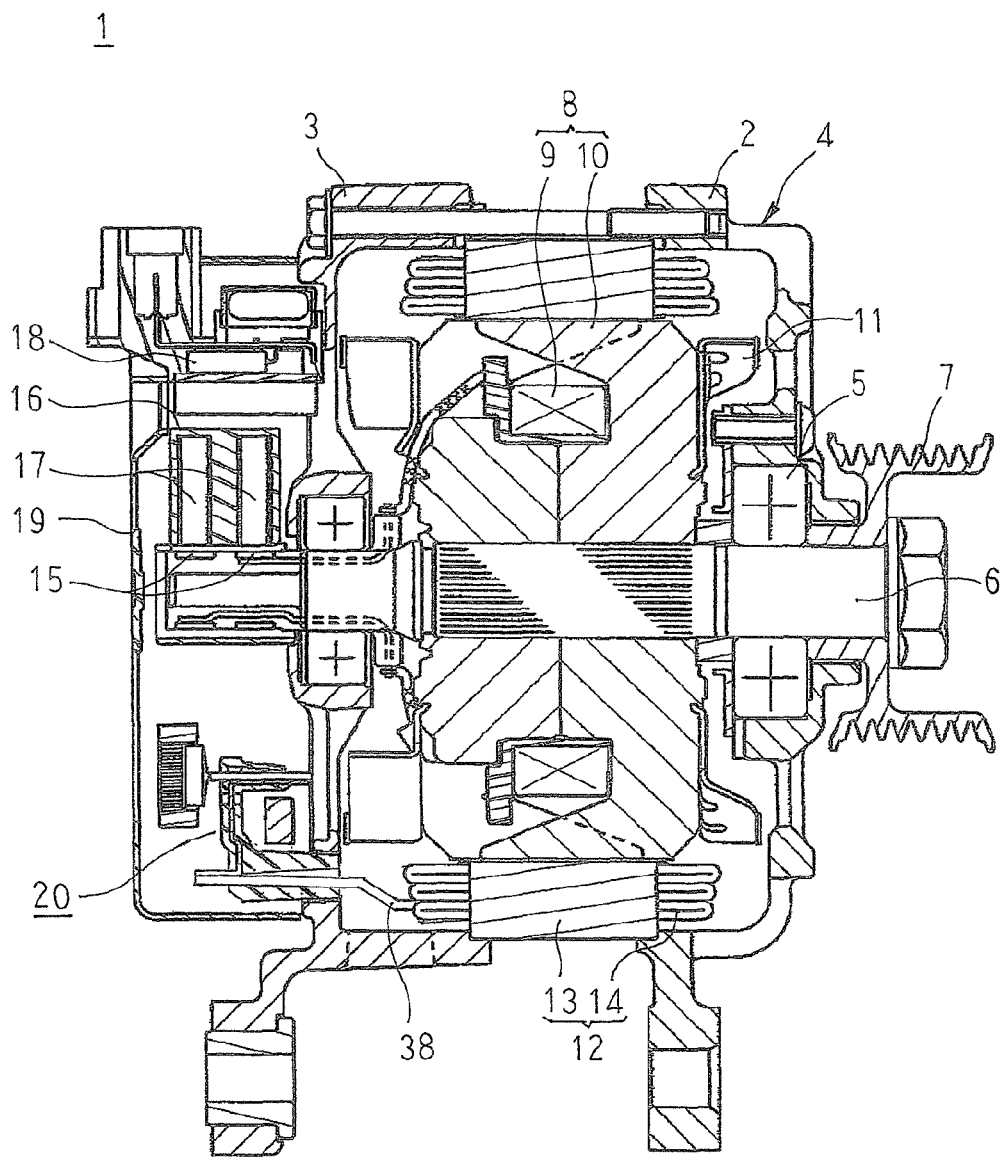
FIG. 1 is a cross section that explains a configuration of an automotive alternator according to Embodiment 1 of the present invention.
Figure 2:
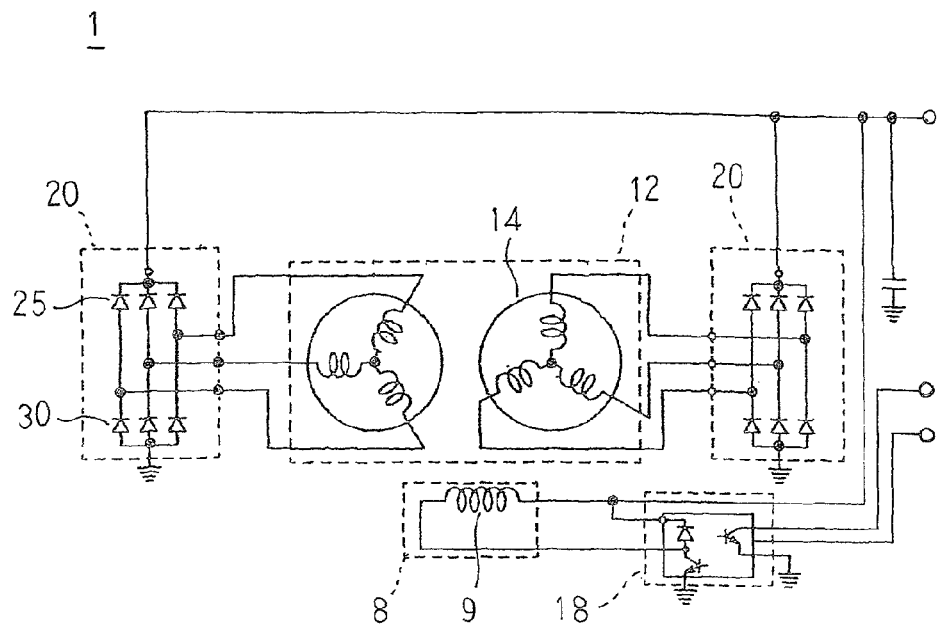
FIG. 2 is a circuit configuration diagram for the automotive alternator according to Embodiment 1 of the present invention.
Figure 3:
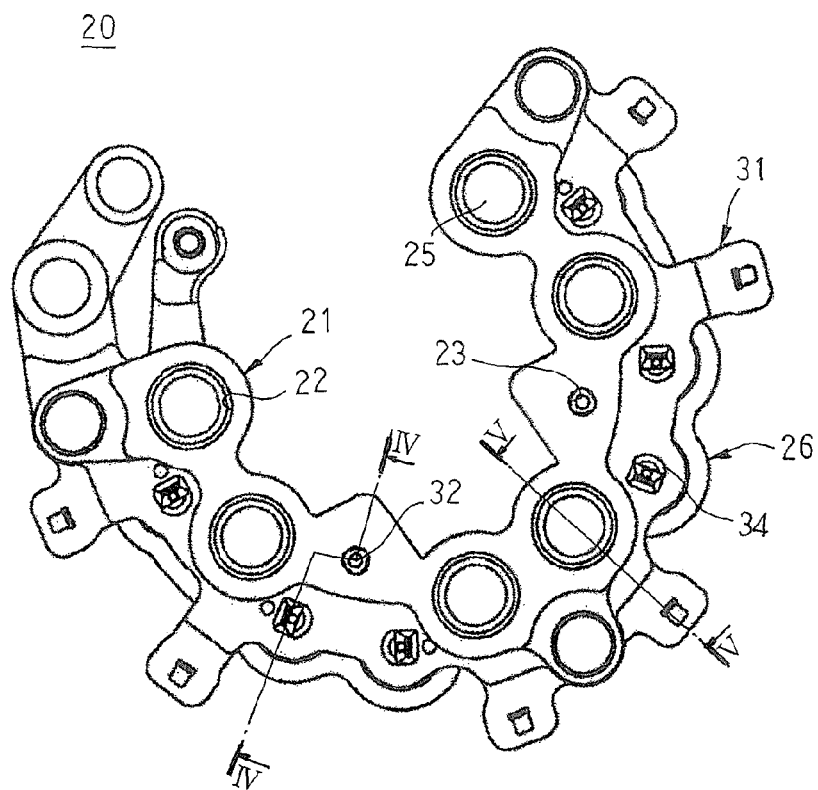
FIG. 3 is a front elevation that shows an automotive alternator rectifying apparatus according to Embodiment 1 of the present invention.
Figure 4:
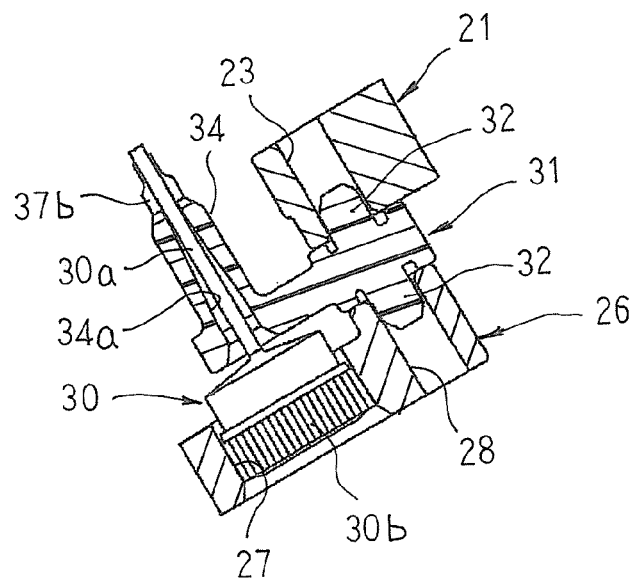
FIG. 4 is a cross section that is taken along Line IV-IV in FIG. 3 so as to be viewed in the direction of the arrows.
Figure 5:
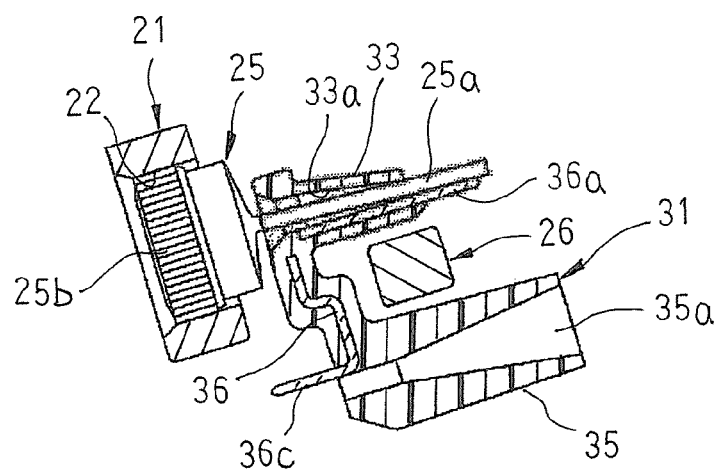
FIG. 5 is a cross section that is taken along Line V-V in FIG. 3 so as to be viewed in the direction of the arrows.
Figure 6:
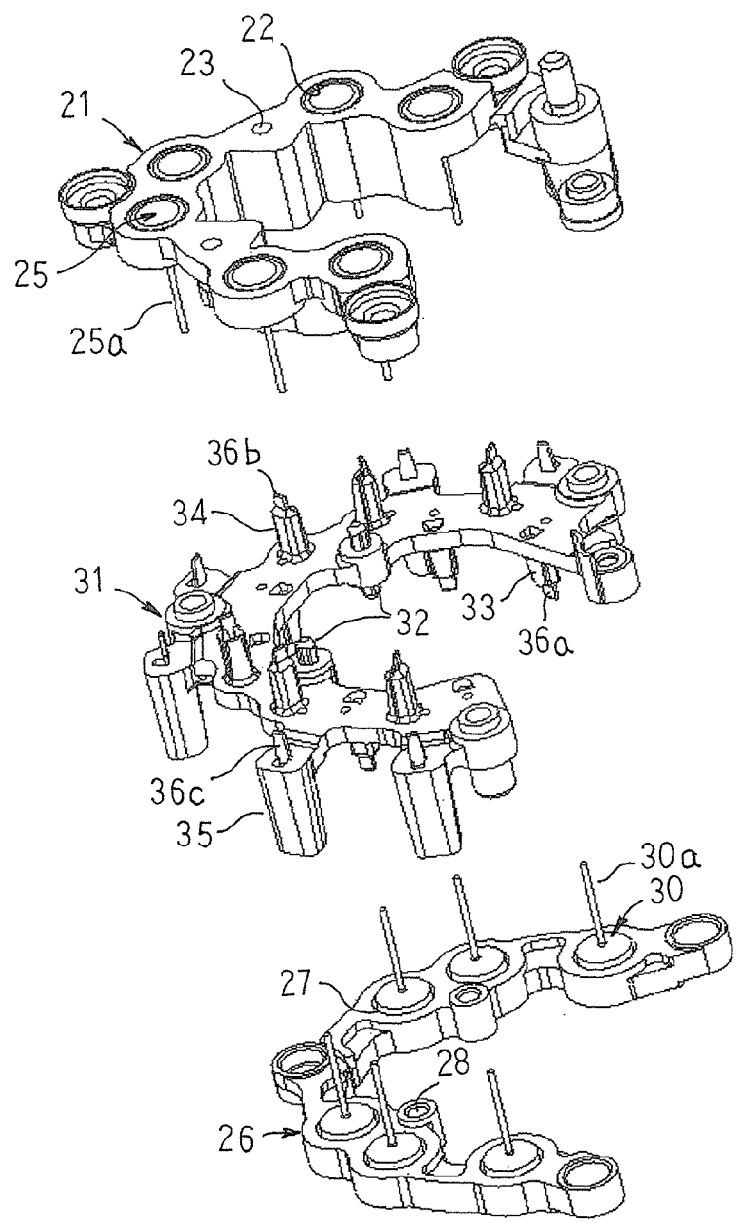
FIG. 6 is an exploded perspective that shows the automotive alternator rectifying apparatus according to Embodiment 1 of the present invention.
Figure 7:
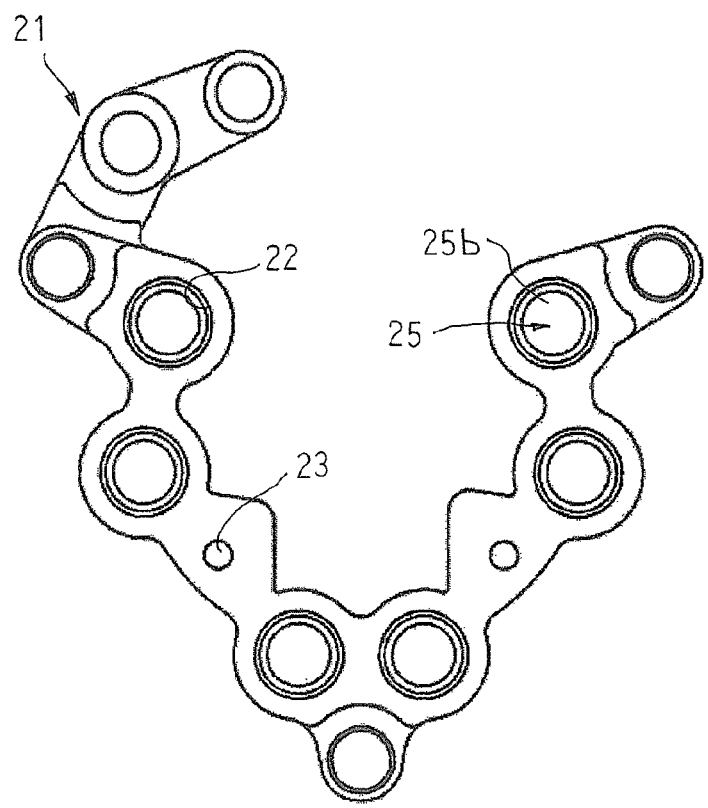
FIG. 7 is a front elevation that shows a positive-side heatsink that is used in the automotive alternator rectifying apparatus according to Embodiment 1 of the present invention.
Figure 8:
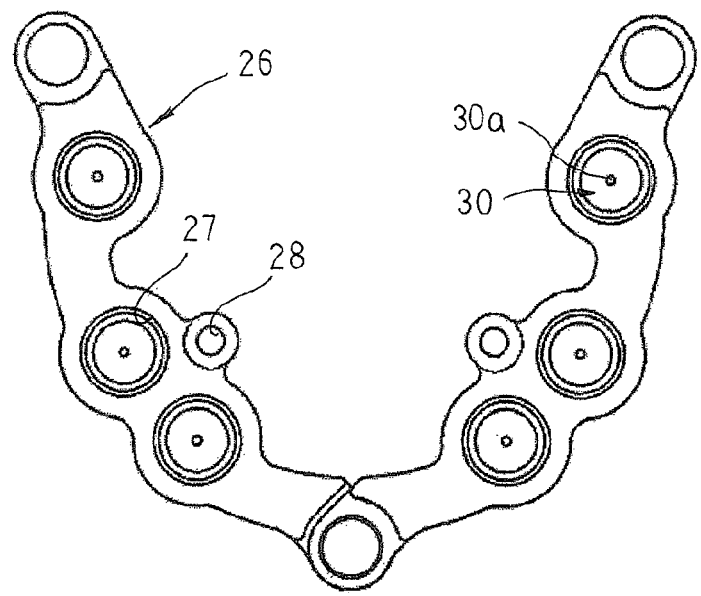
FIG. 8 is a front elevation that shows a negative-side heatsink that is used in the automotive alternator rectifying apparatus according to Embodiment 1 of the present invention.
Figure 9:
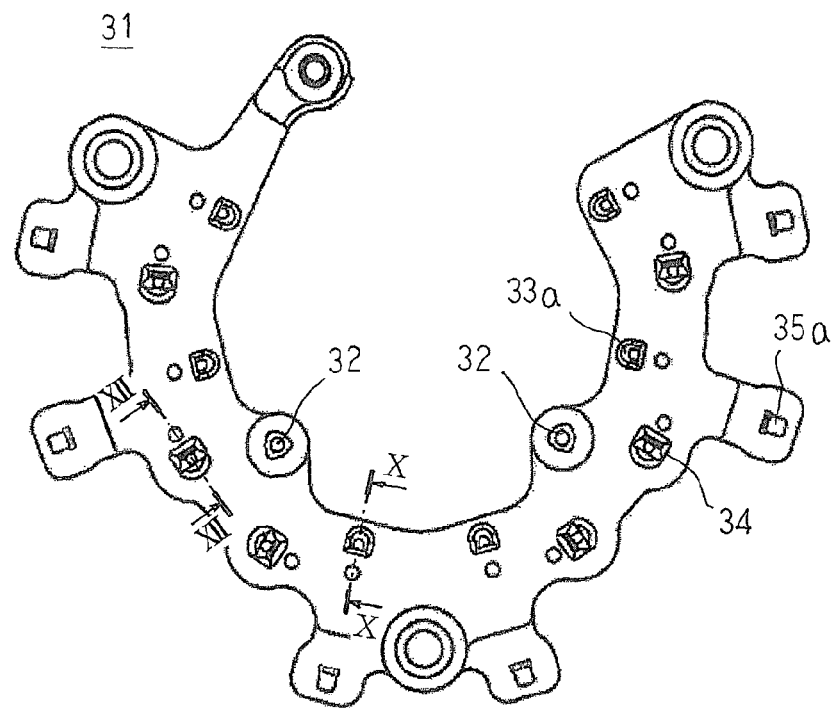
FIG. 9 is a front elevation that shows a circuit board that is used in the automotive alternator rectifying apparatus according to Embodiment 1 of the present invention.
Figure 10:
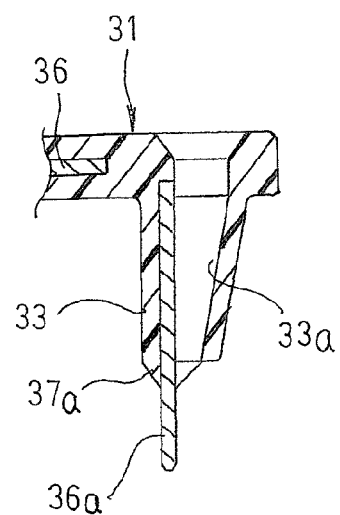
FIG. 10 is a cross section that is taken along Line X-X in FIG. 9 so as to be viewed in the direction of the arrows.
Figure 11:
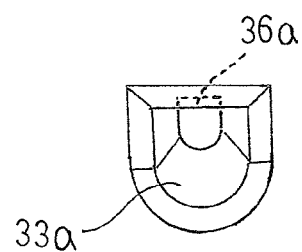
FIG. 11 is a front elevation that shows part of the circuit board that is used in the automotive alternator rectifying apparatus according to Embodiment 1 of the present invention enlarged.
Figure 12:
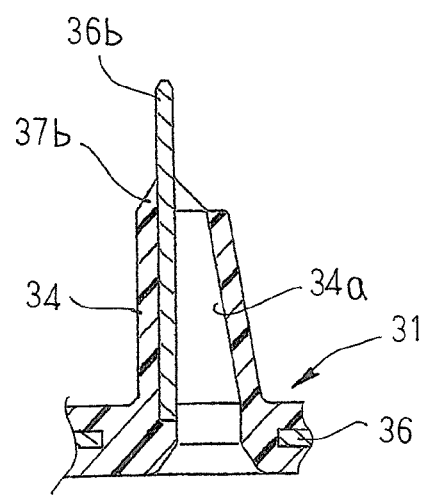
FIG. 12 is a cross section that is taken along Line XII-XII in FIG. 9 so as to be viewed in the direction of the arrows.

FIG. 1 is a cross section that explains a configuration of an automotive alternator according to Embodiment 1 of the present invention, FIG. 2 is a circuit configuration diagram for the automotive alternator according to Embodiment 1 of the present invention, FIG. 3 is a front elevation that shows an automotive alternator rectifying apparatus according to Embodiment 1 of the present invention, FIG. 4 is a cross section that is taken along Line IV-IV in FIG. 3 so as to be viewed in the direction of the arrows, FIG. 5 is a cross section that is taken along Line V-V in FIG. 3 so as to be viewed in the direction of the arrows, FIG. 6 is an exploded perspective that shows the automotive alternator rectifying apparatus according to Embodiment 1 of the present invention, FIG. 7 is a front elevation that shows a positive-side heatsink that is used in the automotive alternator rectifying apparatus according to Embodiment 1 of the present invention, FIG. 8 is a front elevation that shows a negative-side heatsink that is used in the automotive alternator rectifying apparatus according to Embodiment 1 of the present invention, FIG. 9 is a front elevation that shows a circuit board that is used in the automotive alternator rectifying apparatus according to Embodiment 1 of the present invention, FIG. 10 is a cross section that is taken along Line X-X in FIG. 9 so as to be viewed in the direction of the arrows, FIG. 11 is a front elevation that shows part of the circuit board that is used in the automotive alternator rectifying apparatus according to Embodiment 1 of the present invention enlarged, and FIG. 12 is a cross section that is taken along Line XII-XII in FIG. 9 so as to be viewed in the direction of the arrows.

In FIG. 1, an automotive alternator 1 includes: a housing 4 that is constituted by a front bracket 2 and a rear bracket 3 that are each approximately bowl-shaped and made of aluminum; a shaft 6 that is rotatably supported in the housing 4 by means of a pair of bearings 5; a pulley 7 that is fixed to an end portion of the shaft 6 that projects out frontward from the housing 4; a rotor 8 that is fixed to the shaft 6 and that is disposed inside the housing 4; fans 11 that are fixed to two axial end surfaces of the rotor 8; a stator 12 that is fixed to the housing 4 so as to surround the rotor 8; a pair of slip rings 15 that are fixed to a portion of the shaft 6 that projects out rearward from the housing 4, and that supply electric current to the rotor 8; a rectifying apparatus 20 that is prepared so as to have an approximate C shape, that is disposed outside the slip rings 15 in a fan shape that is centered around the shaft 6 in a plane that is perpendicular to the shaft 6, and that rectifies alternating-current voltages that are generated in the stator 12 into a direct-current voltage; a pair of brushes 17 that are housed inside a brush holder 16 that is disposed outside the pair of slip rings 15 between tip ends of the approximate C shape of the rectifying apparatus 20 so as to slide on the respective slip rings 15; a voltage regulator 18 that is mounted to the brush holder 16 and that adjusts magnitude of the alternating-current voltages that are generated in the stator 12; and a cover 19 that is mounted to the rear bracket 3 so as to cover the rectifying apparatus 20, the brush holder 16, and the voltage regulator 18.

The rotor 8 is a Lundell rotor, and includes: a field winding 9 that generates magnetic flux on passage of an excitation current; and a pole core 10 that is disposed so as to cover the field winding 9, and in which magnetic poles are formed by the magnetic flux. The stator 12 includes: a cylindrical stator core 13; and a stator winding 14 that is mounted into the stator core 13, and in which an alternating current is generated by changes in the magnetic flux from the field winding 9 that accompany rotation of the rotor 8, and is disposed such that the stator core 13 is held by the front bracket 2 and the rear bracket 3 from two axial ends so as to surround the rotor 8. The stator winding 14 is constituted by two wye-connected three-phase alternating-current windings.

Next, configuration of the rectifying apparatus 20 will be explained with reference to FIGS. 3 through 12.

As shown in FIGS. 3 and 6, the rectifying apparatus 20 has: a positive-side heatsink 21 to which six positive-side rectifying elements 25 are mounted; a negative-side heatsink 26 to which six negative-side rectifying elements 30 are mounted; and a circuit board 31 that connects the positive-side rectifying elements 25 and the negative-side rectifying elements 30 so as to configure bridge circuits.

The positive-side heatsink 21 is prepared so as to have an approximate C shape using aluminum, for example, as shown in FIGS. 3, 6, and 7. Six rectifying element interfitting apertures 22 are formed on the positive-side heatsink 21 so as to be spaced apart circumferentially, and such that each passes through in a thickness direction. Two circuit board holding apertures 23 are also formed on the positive-side heatsink 21 so as to be spaced apart circumferentially, and such that each passes through in a thickness direction.

As shown in FIG. 5, the positive-side rectifying elements 25 are configured by sealing in a resin a semiconductor element that has been formed into a p-n junction, for example, and have: a lead 25a that is connected to an anode; and a cylindrical copper base 25b that is connected to a cathode. The positive-side rectifying elements 25 are mounted to the positive-side heatsink 21 by press-fitting the bases 25b into the respective rectifying element interfitting apertures 22. The leads 25a of the positive-side rectifying elements 25 extend outward at the rear end so as to be approximately perpendicular to the rear surface of the positive-side heatsink 21. Serrations are formed on outer circumferential surfaces of the bases 25b, ensuring sufficient engaging strength and electrical connection.

The negative-side heatsink 26 is prepared so as to have an approximate C shape using aluminum, for example, as shown in FIGS. 3, 6, and 8. Six rectifying element interfitting apertures 27 are formed on the negative-side heatsink 26 so as to be spaced apart circumferentially, and such that each passes through in a thickness direction. Two circuit board holding apertures 28 are also formed on the negative-side heatsink 26 so as to be spaced apart circumferentially, and such that each passes through in a thickness direction.

As shown in FIG. 4, the negative-side rectifying elements 30 are configured by sealing in a resin a semiconductor element that has been formed into a p-n junction, for example, and have: a lead 30a that is connected to a cathode; and a cylindrical copper base 30b that is connected to an anode. The negative-side rectifying elements 30 are mounted to the negative-side heatsink 26 by press-fitting the bases 30b into the respective rectifying element interfitting apertures 27 such that the leads 30a extend outward on a front surface side. Serrations are formed on outer circumferential surfaces of the bases 30b, ensuring sufficient engaging strength and electrical connection.

As shown in FIGS. 6 and 9, the circuit board 31 is a resin-molded body that is molded into an approximate C shape using an insulating resin such as polybutylene terephthalate (PBT), etc., and a plurality of inserted conductors 36 are insert-molded therein. Two pairs of interfitting salient portions 32 are disposed so as to stand coaxially on front and rear surfaces of the circuit board 31 so as to be separated in a circumferential direction. Six tubular positive-side lead guiding portions 33 are disposed so as to project from the rear surface of the circuit board 31 so as to be separated in a circumferential direction. Six tubular negative-side lead guiding portions 34 are disposed so as to project from the front surface of the circuit board 31 so as to be separated in a circumferential direction. Six tubular stator lead guiding portions 35 are disposed so as to project from the rear surface of the circuit board 31 from an outer circumferential portion so as to be separated in a circumferential direction.

The inserted conductor 36 are respectively insert-molded into the circuit board 31 so as to extend outward at each of a corresponding single positive-side lead guiding portion 33, single negative-side lead guiding portion 34, and single stator lead guiding portion 35.

As shown in FIGS. 10 and 11, lead insertion apertures 33a that pass through the circuit board 31 from the front surface side to the rear surface side are formed in the positive-side lead guiding portions 33. The lead insertion apertures 33a are formed so as to have aperture shapes that have approximately D-shaped cross-sectional shapes that are constituted by: a flat surface that is perpendicular to the front surface of the circuit board 31; and a curved surface that links two side edges of the flat surface, and in which spacing between the flat surface and the curved surface in a direction that is perpendicular to the flat surface (a width) becomes gradually narrower from the front surface side toward the rear surface side. End portions of the inserted conductors 36 are formed so as to have rectangular cross-sections, and are bent perpendicular to the front surface of the circuit board 31, are exposed on the flat surfaces of the lead insertion apertures 33a so as to be flush with the flat surfaces, and extend outward from the positive-side lead guiding portion 33 by a predetermined length to constitute terminals 36a. In addition, portions of the circuit board 31 are disposed so as to extend so as to cover the root back surfaces of the portions of the terminals 36a that extend from the positive-side lead guiding portions 33 to constitute reinforcing portions 37a.

Here, entrances to the lead insertion apertures 33a are on the front surface side of the circuit board 31, and exits are on the rear surface side of the circuit board 31. The terminals 36a extend outward from edge portions of the exits of the lead insertion apertures 33a approximately parallel to the direction of projection of the interfitting salient portions 32.

As shown in FIG. 12, lead insertion apertures 34a that pass through the circuit board 31 from the rear surface side to the front surface side are formed in the negative-side lead guiding portions 34. The lead insertion apertures 34a are formed so as to have aperture shapes that have approximately D-shaped cross-sectional shapes that are constituted by: a flat surface that is perpendicular to the rear surface of the circuit board 31; and a curved surface that links two side edges of the flat surface, and in which spacing between the flat surface and the curved surface in a direction that is perpendicular to the flat surface (a width) becomes gradually narrower from the rear surface side toward the front surface side. End portions of the inserted conductors 36 are bent perpendicular to the rear surface of the circuit board 31, are exposed on the flat surfaces of the lead insertion apertures 34a so as to be flush with the flat surfaces, and extend outward from the negative-side lead guiding portions 34 by a predetermined length to constitute terminals 36b. In addition, portions of the circuit board 31 are disposed so as to extend so as to cover the root back surfaces of the portions of the terminals 36b that extend from the negative-side lead guiding portions 34 to constitute reinforcing portions 37b.

Here, entrances to the lead insertion apertures 34a are on the rear surface side of the circuit board 31, and exits are on the front surface side of the circuit board 31. The terminals 36b extend outward from edge portions of the exits of the lead insertion apertures 34a approximately parallel to the direction of projection of the interfitting salient portions 32.

As shown in FIG. 5, lead insertion apertures 35a that have aperture directions that are oriented in a direction that is perpendicular to the rear surface of the circuit board 31 and that pass through the circuit board 31 from the front surface side to the rear surface side are formed in the stator lead guiding portions 35. The lead insertion apertures 35a are formed so as to have aperture shapes that have rectangular cross-sectional shapes, and in which cross-sectional area becomes gradually narrower from the rear surface side of the circuit board 31 toward the front surface side. End portions of the inserted conductor 36 extend outward from exit edge portions of the lead insertion apertures 35a on the front surface of the circuit board 31 by a predetermined length in the aperture directions of the lead insertion apertures 35a to constitute terminals 36c. Here, entrances to the lead insertion apertures 35a are on the rear surface side of the circuit board 31, and exits are on the front surface side of the circuit board 31.

To assemble the rectifying apparatus 20 that is configured in this manner, the circuit board 31 is first disposed between a rear surface of the positive-side heatsink 21 to which the positive-side rectifying elements 25 have been mounted and a front surface of the negative-side heatsink 26 to which the negative-side rectifying elements 30 have been mounted and, as shown in FIG. 4, the interfitting salient portions 32 are press-fitted into the circuit board holding apertures 23 and 28 of the positive-side and negative-side heat sinks 21 and 26. The positive-side heatsink 21, the circuit board 31, and the negative-side heatsink 26 are thereby laminated and integrated by the engaging force of the interfitting salient portions 32 in the circuit board holding apertures 23 and 28.

Here, the leads 25a of the positive-side rectifying elements 25 enter the lead insertion apertures 33a of the positive-side lead guiding portions 33 from the front surface side of the circuit board 31, and tip ends thereof contact the curved surfaces that face the flat surfaces of the lead insertion apertures 33a. With the operation of press-fitting the interfitting salient portions 32 into the circuit board holding apertures 23 and 28, the tip ends of the leads 25a advance along the curved surfaces of the lead insertion apertures 33a toward the rear surface of the circuit board 31. Because the curved surfaces of the lead insertion apertures 33a are inclined from the front surface side of the circuit board 31 toward the rear surface side so as to approach the flat surfaces, the leads 25a are elastically deformed while being inserted into the lead insertion apertures 33a, and the tip ends thereof move closer to the flat surfaces. As shown in FIG. 5, when the tip ends of the leads 25a extend outward from the exits of the lead insertion apertures 33a, they contact the terminals 36a. This state of contact between the tip ends of the leads 25a and the terminals 36a is held by the force of recovery due to elastic deformation of the leads 25a.

The leads 30a of the negative-side rectifying elements 30 enter the lead insertion apertures 34a of the negative-side lead guiding portions 34 from the rear surface side of the circuit board 31, and tip ends thereof contact the curved surfaces that face the flat surfaces of the lead insertion apertures 34a. With the operation of press-fitting the interfitting salient portions 32 into the circuit board holding apertures 23 and 28, the tip ends of the leads 30a advance along the curved surfaces of the lead insertion apertures 34a toward the front surface of the circuit board 31. Because the curved surfaces of the lead insertion apertures 34a are inclined from the rear surface side of the circuit board 31 toward the front surface side so as to approach the flat surfaces, the leads 30a are elastically deformed while being inserted into the lead insertion apertures 34a, and the tip ends thereof move closer to the flat surfaces. When the tip ends of the leads 30a extend outward from the exits of the lead insertion apertures 34a, they contact the terminals 36b. This state of contact between the tip ends of the leads 30a and the terminals 36b is held by the force of recovery due to elastic deformation of the leads 30a.

Next, the rectifying apparatus 20 is assembled by TIG welding the leads 25a and 30a of the positive-side and negative-side rectifying elements 25 and 30 and the terminals 36a and 36b. As shown in FIG. 2, this rectifying apparatus 20 is configured into two three-phase diode bridges that are formed by arranging in parallel three rectifying element pairs that have been configured by connecting the positive-side rectifying elements 25 and the negative-side rectifying elements 30 in series.

A rectifying apparatus 20 that has been assembled in this manner is mounted to the automotive alternator 1 by orienting the negative-side heatsink 26 toward the rear bracket 3, and fastening to an outer end surface of the rear bracket 3 a mounting bolt (not shown) that is inserted through the positive-side heatsink 21, the circuit board 31, and the negative-side heatsink 26. The positive-side heatsink 21, the circuit board 31 and the negative-side heatsink 26 are integrated by the fastening force from this mounting bolt, and the negative-side heatsink 26 is electrically connected to the rear bracket 3. Moreover, electrical insulation is ensured between the positive-side heatsink 21 and the mounting bolt.

Although not shown, output terminal bolts are mounted to the positive-side heatsink 21, are electrically connected to the cathodes of each of the positive-side rectifying elements 25 through the positive-side heatsink 21, and constitute output terminals of the rectifying apparatus 20. The anodes of each of the negative-side rectifying elements 30 are grounded through the negative-side heatsink 26 and the rear bracket 3.

In addition, lead wires 38 of the stator winding 14 are inserted into the lead insertion apertures 35a from entrances of the stator lead guiding portions 35. The tip ends of the lead wires 38 that extend outward from the exits of the lead insertion apertures 35a are TIG-welded to the terminals 36c. Respective connecting points between the positive-side rectifying elements 25 and the negative-side rectifying elements 30 of the three-phase diode bridges are thereby connected to end portions of the phase windings of the respective three-phase alternating-current windings of the stator winding 14 by means of the inserted conductors 36, as shown in FIG. 2. In addition, the field winding 9 is connected to the voltage regulator 18 through the slip rings 15 and the brushes 17.

Next, operation of an automotive alternator 1 that has been configured in this manner will be explained.

First, electric current is supplied to the field winding 9 of the rotor 8 by means of the brushes 17 and the slip rings 15 to generate magnetic flux. North-seeking (N) poles and South-seeking (S) poles are formed alternately in a circumferential direction on outer circumferential portions of the pole core 10 by this magnetic flux.

At the same time, rotational torque from an engine (not shown) is transferred to the shaft 6 by means of a belt (not shown) and the pulley 7, rotating the rotor 8. Thus, rotating magnetic fields are applied to the stator winding 14 in the stator 12, generating electromotive forces in the stator winding 14. These alternating-current electromotive forces are rectified into direct current by the rectifying apparatus 20, and supplied to on-board loads, and to a battery, etc. The on-board loads are thereby driven, and the battery is charged.

According to Embodiment 1, tubular positive-side and negative-side lead guiding portions 33 and 34 are disposed so as to project from a circuit board 31, lead insertion apertures 33a and 34a of the positive-side and negative-side lead guiding portions 33 and 34 are formed so as to have aperture shapes in which the cross-sectional area thereof becomes gradually smaller from the entrance end toward the exit end, and terminals 36a and 36b are disposed on the circuit board 31 so as to extend outward in the aperture directions of the lead insertion apertures 33a and 34a from exit edge portions of the lead insertion apertures 33a and 34a of the positive-side and negative-side lead guiding portions 33 and 34. Thus, during assembly of the rectifying apparatus 20, the leads 25a and 30a of the positive-side and negative-side rectifying elements 25 and 30 enter the lead insertion apertures 33a and 34a through large-area entrances, are guided by inner wall surfaces of the lead insertion apertures 33a and 34a and proceed to the exit end, and extend outward from the exits so as to lie alongside the terminals 36a and 36b.

Consequently, positioning between the terminals 36a and 36b of the circuit board 31 and the leads 25a and 30a of the positive-side and negative-side rectifying elements 25 and 30 is facilitated during assembly, improving welding workability.

It is not necessary to ensure positioning accuracy of the tip ends of the leads 25a and 30a of all of the positive-side and negative-side rectifying elements 25 and 30 that are mounted onto the positive-side and negative-side heat sinks 21 and 26 with high precision, enabling costs for manufacturing the rectifying apparatus 20 to be reduced.

Because large portions of the leads 25a and 30a of the positive-side and negative-side rectifying elements 25 and 30 are housed inside the positive-side and negative-side lead guiding portions 33 and 34, occurrences of short-circuiting between other parts due to exposure to moisture or vibration can be suppressed when the automotive alternator 1 is mounted to a vehicle.

Tubular stator lead guiding portions 35 are disposed so as to project from a circuit board 31, lead insertion apertures 35a of the stator lead guiding portions 35 are formed so as to have aperture shapes in which the cross-sectional area thereof becomes gradually smaller from the entrance side toward the exit end, and terminals 36c are disposed on the circuit board 31 so as to extend outward in the aperture directions of the lead insertion apertures 35a from exit edge portions of the lead insertion apertures 35a of the stator lead guiding portions 35. Thus, the lead wires 38 of the stator winding 14 enter the lead insertion apertures 35a through large-area entrances, are guided by inner wall surfaces of the lead insertion apertures 35a and proceed to the exit end, and extend outward from the exits so as to lie alongside the terminals 36c. Consequently, positioning between the terminals 36c of the circuit board 31 and the lead wires 38 of the stator winding 14 is facilitated during assembly, improving welding workability.

The lead insertion apertures 33a and 34a of the positive-side and negative-side lead guiding portions 33 and 34 are formed so as to have aperture shapes that have approximately D-shaped cross-sectional shapes that are constituted by: a flat surface that is perpendicular to the front surface of the circuit board 31; and a curved surface that links two side edges of the flat surface, and in which spacing between the flat surface and the curved surface in a direction that is perpendicular to the flat surface becomes gradually narrower from the entrance end toward the exit end.

Thus, the tip ends of the leads 25a and 30a that are inserted into the lead insertion apertures 33a and 34a move along the curved surfaces of the lead insertion apertures 33a and 34a toward the flat surfaces while moving toward the exit end. Tip end portions of the leads 25a and 30a that extend outward from the exits of the lead insertion apertures 33a and 34a come into contact with the terminals 36a and 36b. In addition, the leads 25a and 30a are elastically deformed by the tip ends of the leads 25a and 30a moving along the curved surfaces of the lead insertion apertures 33a and 34a. This state of contact between the tip end portions of the leads 25a and 30a and the terminals 36a and 36b is held by the force of recovery from the elastic deformation of the leads 25a and 30a. Consequently, a step of chucking to grip the tip end portions of the leads 25a and 30a and the terminals 36a and 36b is no longer required during TIG welding, enabling assembly man-hours to be reduced, and also improving assembly.

Interfitting salient portions 32 are disposed so as to protrude from the circuit board 31, and circuit board holding apertures 23 and 28 into which the interfitting salient portions 32 are fitted are formed on the positive-side and negative-side heat sinks 21 and 26. Thus, positioning between the lead insertion apertures 33a and 34a of the positive-side and negative-side lead guiding portions 33 and 34 and the leads 25a and 30a of the positive-side and negative-side rectifying elements 25 and 30 is performed by fitting the interfitting salient portions 32 into the circuit board holding apertures 23 and 28, improving assembly of the rectifying apparatus 20.

Because the reinforcing portions 37a and 37b are disposed so as to extend to cover root back surfaces of the portions of the terminals 36a and 36b that extend outward from the positive-side and negative-side lead guiding portions 33 and 34, collapsing of the terminals 36a and 36b when the tip ends of the leads 25a and 30a that extend outward from the lead insertion apertures 33a and 34a contact the terminals 36a and 36b is prevented.

Embodiment 2

Figure 13:
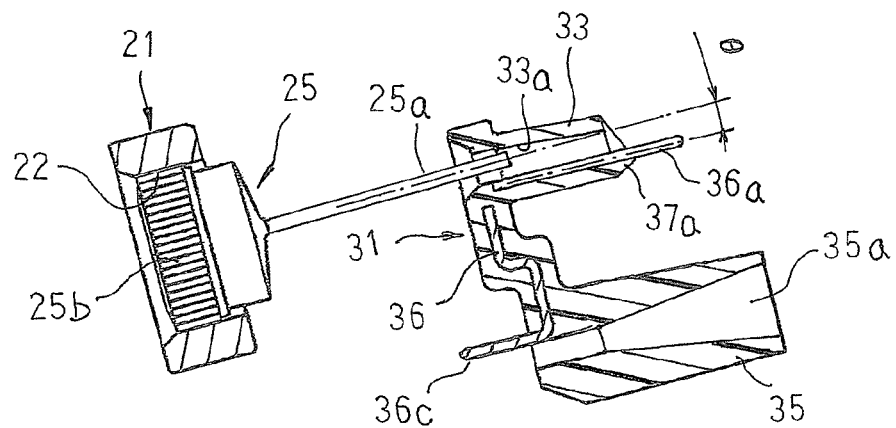
FIG. 13 is a partial cross section that explains an assembly step in an automotive alternator rectifying apparatus according to Embodiment 2 of the present invention.

FIG. 13 is a partial cross section that explains an assembly step in an automotive alternator rectifying apparatus according to Embodiment 2 of the present invention.

In FIG. 13, positive-side rectifying elements 25 are mounted onto a positive-side heatsink 21 such that axial directions of leads 25a and axial directions of terminals 36a have a predetermined angle θ in a direction in which tip ends of the leads 25a are separated from the terminals 36a toward exit ends of lead insertion apertures 33a when the positive-side heatsink 21 is mounted onto a circuit board 31.

Moreover, negative-side rectifying elements 30 are also mounted onto a negative-side heatsink 26 similarly, and explanation thereof will be omitted here.

The rest of the configuration is configured in a similar or identical manner to that of Embodiment 1 above.

In Embodiment 2, the axial directions of the leads 25a are offset from the axial directions of the terminals 36a in directions in which tip ends of the leads 25a are separated from the terminals 36a toward exit ends of lead insertion apertures 33a. Because the terminals 36a extend outward vertically from the rear surface of the circuit board 31, and the interfitting salient portions 32 are disposed so as to project vertically from the rear surface of the circuit board 31, the axial directions of the terminals 36a are aligned with press-fitting directions of the interfitting salient portions 32 into the circuit board holding apertures 23. Thus, during the operation of press-fitting the interfitting salient portions 32 into the circuit board holding apertures 23, the tip ends of the leads 25a contact the curved surfaces of the lead insertion apertures 33a reliably, and advance to the exit ends of the lead insertion apertures 33a along the curved surfaces, and the amount of elastic deformation of the leads 25a is increased. Because the state of contact between the tip ends of the leads 25a and the terminals 36a is thereby held reliably, a step of chucking is no longer required, and welding quality in the TIG welding is also stabilized.

Embodiment 3

Figure 14:
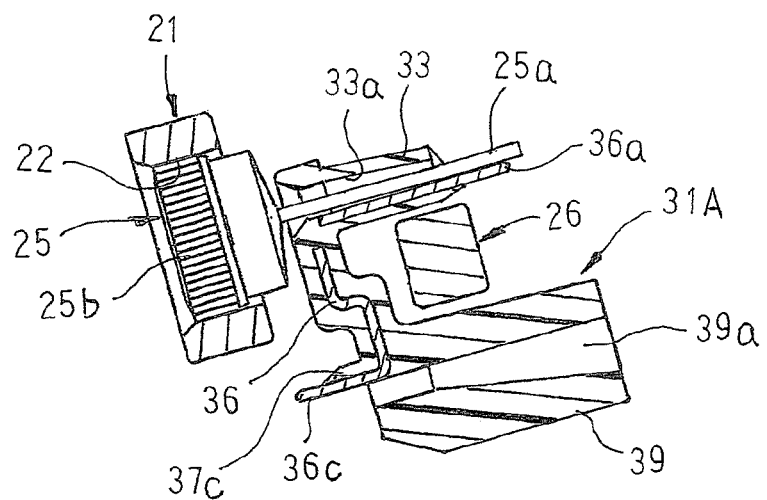
FIG. 14 is a partial cross section that shows an automotive alternator rectifying apparatus according to Embodiment 3 of the present invention.

FIG. 14 is a partial cross section that shows an automotive alternator rectifying apparatus according to Embodiment 3 of the present invention.

In FIG. 14, stator lead guiding portions 39 are disposed so as to protrude from an outer circumferential portion of a circuit board 31A on a rear surface side so as to be separated in a circumferential direction, and lead insertion apertures 39a that pass through the circuit board 31A from the rear surface side to a front surface side are formed therein. The lead insertion apertures 39a are formed so as to have aperture shapes that have approximately D-shaped cross-sectional shapes that are constituted by: a flat surface that is perpendicular to the rear surface of the circuit board 31A; and a curved surface that links two side edges of the flat surface, and in which spacing between the flat surface and the curved surface in a direction that is perpendicular to the flat surface (a width) becomes gradually narrower from the front surface side toward the rear surface side. End portions of inserted conductors 36 are exposed on the flat surfaces of the lead insertion apertures 39a so as to be flush with the flat surfaces, and extend outward from the stator lead guiding portions 39 by a predetermined length to constitute terminals 36c. In addition, portions of the circuit board 31A are disposed so as to extend so as to cover root back surfaces of the portions of the terminals 36c that extend from the stator lead guiding portions 39 to constitute reinforcing portions 37c.

Moreover, the rest of the configuration is configured in a similar or identical manner to that of Embodiment 1 above.

In Embodiment 3, the tip ends of the lead wires 38 that are inserted into the lead insertion apertures 39a move along the curved surfaces of the lead insertion apertures 39a toward the flat surface while moving toward the exit end. Tip end portions of the lead wires 38 that extend outward from the exits of the lead insertion apertures 39a come into contact with the terminals 36c. In addition, the lead wires 38 are elastically deformed by the tip ends of the lead wires 38 moving along the curved surfaces of the lead insertion apertures 39a. This state of contact between the tip end portions of the lead wires 38 and the terminals 36c is held by the force of recovery from the elastic deformation of the lead wires 38.

Consequently, a step of chucking to grip the tip end portions of the lead wires 38 and the terminals 36c is no longer required during TIG welding, enabling assembly man-hours to be reduced, and also improving assembly.

Moreover, in each of the above embodiments, a brush holder, a voltage regulator, and a rectifying apparatus are disposed outside a housing, but these parts may also be disposed inside a rear bracket so as to face a rotor, for example.

In each of the above embodiments, six positive-side and six negative-side rectifying elements are mounted to the positive-side and negative-side heat sinks, but the numbers of positive-side and negative-side rectifying elements are not limited to six, and if the stator winding is constituted by a single set of three-phase alternating-current windings, for example, three positive-side and three negative-side heat sinks should be mounted to positive-side and negative-side rectifying elements.

In each of the above embodiments, positive-side and negative-side heat sinks are each constituted by single approximately C-shaped heatsink bodies, but the positive-side and negative-side heat sinks may also be configured by arranging a plurality of the heatsink bodies into an approximate C shape.

In each of the above embodiments, positive-side and negative-side heat sinks that have no radiating fins have been used, but it goes without saying that positive-side and negative-side heat sinks that have radiating fins may also be used.

In each of the above embodiments, a rectifying apparatus that is configured by stacking a positive-side heatsink, a circuit board, and a negative-side heatsink is fastened to a rear bracket, but order of axial arrangement of these parts is not limited to the order of the positive-side heatsink, the circuit board, the negative-side heatsink, and the rear bracket. For example, an order of a negative-side heatsink, a circuit board, a positive-side heatsink, and the rear bracket, an order of a positive-side heatsink, a negative-side heatsink, a circuit board, and a rear bracket, an order of a negative-side heatsink, a positive-side heatsink, a circuit board, and a rear bracket, an order of a circuit board, a positive-side heatsink, a negative-side heatsink, and a rear bracket, or an order of a circuit board, a negative-side heatsink, a positive-side heatsink, and a rear bracket is also acceptable. Positive-side lead guiding portions, negative-side lead guiding portions, and stator lead guiding portions must be disposed so as to protrude from a front surface side and a rear surface side of the circuit board so as to correspond to the above-mentioned order of axial arrangement.

The invention claimed is:

1. An automotive alternator rectifying apparatus that rectifies an alternating-current electromotive force that is generated in an automotive alternator stator into direct current, said rectifying apparatus comprising:
a positive-side heatsink to which a positive-side rectifying element is mounted;
a negative-side heatsink that is disposed so as to be separated from said positive-side heatsink, and to which a negative-side rectifying element is mounted; and
a circuit board that is disposed so as to be stacked with said positive-side heatsink and said negative-side heatsink, and that connects said positive-side rectifying element and said negative-side rectifying element to configure a bridge circuit,
wherein:
said circuit board comprises:
a tubular lead guiding portion that comprises a lead insertion aperture; and
a terminal that is disposed so as to extend outward in an aperture direction of said lead insertion aperture from an exit edge portion of said lead insertion aperture, and to which is connected a lead that is subject to connection that is inserted through an entrance of said lead insertion aperture and that extends outward from an exit; and
said lead insertion aperture is formed such that cross-sectional area thereof becomes gradually smaller from said entrance toward said exit except in a region in a portion near said entrance of said lead insertion aperture.

2. An automotive alternator rectifying apparatus according to claim 1, wherein a reinforcing portion is formed integrally on said lead guiding portion so as to cover a back surface near a root of said terminal.

3. An automotive alternator rectifying apparatus that rectifies an alternating-current electromotive force that is generated in an automotive alternator stator into direct current, said rectifying apparatus comprising:
a positive-side heatsink to which a positive-side rectifying element is mounted;
a negative-side heatsink that is disposed so as to be separated from said positive-side heatsink, and to which a negative-side rectifying element is mounted; and
a circuit board that is disposed so as to be stacked with said positive-side heatsink and said negative-side heatsink, and that connects said positive-side rectifying element and said negative-side rectifying element to configure a bridge circuit,
wherein:
said circuit board comprises:
a tubular lead guiding portion that comprises a lead insertion aperture; and
a terminal that is disposed so as to extend outward in an aperture direction of said lead insertion aperture from an exit edge portion of said lead insertion aperture, and to which is connected a lead that is subject to connection that is inserted through an entrance of said lead insertion aperture and that extends outward from an exit; and
said lead insertion aperture is formed such that cross-sectional area thereof becomes gradually smaller from said entrance toward said exit, and
wherein:
a wall surface of said lead insertion aperture that faces said terminal is formed into an inclined surface that gradually approaches said terminal in an axial direction from said entrance toward said exit; and
a tip end of said lead that is subject to connection that extends outward from said exit of said lead insertion aperture comes into contact with said terminal.

4. An automotive alternator rectifying apparatus according to claim 3, wherein:
said leads that are subject to connection are leads of said positive-side rectifying element and said negative-side rectifying element; and
said positive-side rectifying element and said negative-side rectifying element are mounted onto said positive-side heatsink and said negative-side heatsink such that respective axial directions of said leads are separated from an axial direction of said terminal from said entrance of said lead insertion aperture toward said exit.

* * * * *